(12) United States Patent
Wu et al.

(10) Patent No.: US 11,859,314 B2
(45) Date of Patent: Jan. 2, 2024

(54) METHOD FOR PREPARING LARGE SIZE BETA-TYPE AMMONIUM TETRAMOLYBDATE MONOCRYSTAL PARTICLE

(71) Applicant: ZHENGZHOU UNIVERSITY, Zhengzhou (CN)

(72) Inventors: Xiaochao Wu, Zhengzhou (CN); Qingkui Li, Zhengzhou (CN); Jing Zhang, Zhengzhou (CN); Kaijun Yang, Zhengzhou (CN); Chengduo Wang, Zhengzhou (CN); Jilin He, Zhengzhou (CN)

(73) Assignee: ZHENGZHOU UNIVERSITY, Zhengzhou (CN)

( * ) Notice: Subject to any disclaimer, the term of this patent is extended or adjusted under 35 U.S.C. 154(b) by 0 days.

(21) Appl. No.: 17/834,238

(22) Filed: Jun. 7, 2022

(65) Prior Publication Data
US 2022/0403545 A1  Dec. 22, 2022

(30) Foreign Application Priority Data

Jun. 9, 2021 (CN) .......................... 202110645674.7

(51) Int. Cl.
*C30B 7/08* (2006.01)
*C30B 33/02* (2006.01)

(52) U.S. Cl.
CPC ................ *C30B 7/08* (2013.01); *C30B 33/02* (2013.01)

(58) Field of Classification Search
CPC .. C30B 7/00; C30B 7/08; C30B 33/02; C30B 29/16
See application file for complete search history.

(56) References Cited

U.S. PATENT DOCUMENTS 4,382,069 A * 5/1983 Heytmeijer ............ C01G 39/00
423/58

FOREIGN PATENT DOCUMENTS

| CN | 102502844 A | 6/2012 |
| CN | 102583542 | * 7/2012 |

(Continued)

OTHER PUBLICATIONS

Search Report in Chinese Application No. 202110645674.7; dated Jan. 18, 2022; 3 pgs.

(Continued)

*Primary Examiner* — Robert M Kunemund
(74) *Attorney, Agent, or Firm* — HAUPTMAN HAM, LLP

(57) ABSTRACT

A method for preparing large size beta-type ammonium tetramolybdate monocrystal particle includes industrial ammonium molybdate, ammonia, de-ionized water are used to prepare ammonium molybdate solution with concentration of 0.2~0.6 g/ml; pH is adjusted to 5~7, temperature is adjusted to the first temperature of 70~90° C. to obtain the first ammonium molybdate solution; beta-type ammonium tetramolybdate crystal seed is put into crystallization container, and the first ammonium molybdate solution is poured in the crystallization container, to form crystallization system; the crystallization system stands still at room temperature, naturally cooling, the beta-type ammonium tetramolybdate crystal seed grows into large size beta-type ammonium tetramolybdate monocrystal particle. A beta-type ammonium tetramolybdate crystal seed is obtained by constant-temperature crystallization at 70~90° C. The obtained beta-type ammonium tetramolybdate crystal seed is put stewing in the first ammonium molybdate solution and is naturally cooling to produce large size beta-type ammonium tetramolybdate monocrystal particle forms.

8 Claims, 5 Drawing Sheets

(56) References Cited

FOREIGN PATENT DOCUMENTS

CN 102417207 * 9/2013
CN 104445411 * 3/2015

OTHER PUBLICATIONS

First Office Action in Chinese Application No. 202110645674.7; dated Jan. 27, 2022; 12 pgs.
Zheng-ping Wu, et al.; The preparation of ammonium β-tetra molybdate and the crystallization process; J. Cent. South Univ. Technol., vol. 32, No. 2, Apr. 30, 2001; pp. 135-138 (English Abstract).

* cited by examiner

METHOD FOR PREPARING LARGE SIZE BETA-TYPE AMMONIUM TETRAMOLYBDATE MONOCRYSTAL PARTICLE

RELATED APPLICATIONS

The present application claims priority from Chinese Application Number 202110645674.7, filed Jun. 9, 2021, the disclosure of which is hereby incorporated by reference herein in its entirety.

TECHNICAL FIELD

This disclosure belongs to metallic compound technical field, in particular, the ammonium molybdate technical field, specifically is related to the method for preparing the large size β-type ammonium tetramolybdate monocrystal particle.

BACKGROUND

Ammonium molybdate is polyacid salt composed of $NH_4^+$ cation and different molybdate anion. The form of polyacid in different solution environment appears to be complex so as to form variety of ammonium molybdate product, common ammonium molybdates are ammonium dimolybdate, ammonium trimolybdate, ammonium tetramolybdate, ammonium heptamolybdate, ammonium octamolybdate, and ammonium dodecamolybdate.

Besides small quantity of ammonium heptamolybdate, industrial ammonium molybdate is mainly ammonium tetramolybdate. Ammonium molybdate is raw material to prepare metal molybdenum powder. Metal molybdenum is made of ammonium molybdate after being roasting decomposition and hydrogen reduction.

Ammonium tetramolybdate is metastable crystal and the crystal structure may change due to different conditions, forming isotope isomer which is mainly α-type ammonium tetramolybdate and β-type ammonium tetramolybdate. α-type 30 ammonium tetramolybdate crystalline grain is inhomogeneous, thermal instable, easily weathering to agglomeration, generating intermediate compound during thermal evolution process. The product percent of pass is under 70% when α-type ammonium tetramolybdate is used as raw material to prepare metal molybdenum. β-type ammonium tetramolybdate crystalline grain is homogeneous, with small apparent density, thermal stable, generating no intermediate during thermal evolution. Metal molybdenum has better further processing performance when β-type ammonium tetramolybdate is used as raw material. β-type ammonium tetramolybdate is in huge need in practical application. The crystalline structure of ammonium tetramolybdate has effect not only on the structure and performance of its derivative metal powder, but also on the quality and performance of molybdenum product. With the development of science and technology, molybdenum and its alloy develop in the direction of diversity and fine division, higher demanding for the structure and crystalline type of ammonium tetramolybdate is necessary. So far ammonium polymolybdate cannot meet demand for the high quality of the molybdenum product. Traditional acid precipitation method proceeds in high rate and the operating process is hard to control, resulting in generating mixture of α-type ammonium tetramolybdate and β-type ammonium tetramolybdate. In a word, the preparation of β-type ammonium tetramolybdate monocrystal is difficult to achieve, and the preparation of large size β-type ammonium tetramolybdate monocrystal is more difficult, to which there is no solution so far.

SUMMARY

In view of problems above mentioned, in one aspect, some embodiments disclose a method for preparing a large size β-type ammonium tetramolybdate monocrystal particle, the method comprises:
industrial ammonium molybdate, ammonia water, and de-ionized water are used to prepare an ammonium molybdate solution with the concentration of 0.2~0.6 g/ml; pH of the ammonium molybdate solution is adjusted to 5~7, and the temperature of the ammonium molybdate solution is adjusted to the first temperature of 70~90° C. to obtain a first ammonium molybdate solution;
the β-type ammonium tetramolybdate crystal seed is put in a crystallization container, and the first ammonium molybdate solution is poured into the crystallization container, to form crystallization system; the crystallization system stands still at room temperature, naturally cooling, and the β-type ammonium tetramolybdate crystal seed grows up as the large size β-type ammonium tetramolybdate monocrystal particle product.

Some embodiments further disclose the method for preparing the large size β-type ammonium tetramolybdate monocrystal particle, therein the pH of the ammonium molybdate solution is adjusted to 5~7 by nitric acid to obtain the first ammonium molybdate solution.

Some embodiments disclose the method for preparing the large size β-type ammonium tetramolybdate monocrystal particle, therein a particle size of industrial ammonium molybdate is between 0.7~1.1 μm, D50 is 0.99 μm.

Some embodiments disclose the method for preparing the large size β-type ammonium tetramolybdate monocrystal particle, therein the β-type ammonium tetramolybdate crystal seed is prepared by:
using industrial ammonium molybdate, ammonia water, and de-ionized water to prepare ammonium molybdate solution with the concentration of 0.2~0.6 g/ml;
adjusting the pH of the ammonium molybdate solution to 1~2, adjusting the temperature of the ammonium molybdate solution to a second temperature of 70~90° C. to obtain the second ammonium molybdate solution;
stirring the second ammonium molybdate solution at a constant temperature of the second temperature, crystallizing at the constant temperature for 3~5 min, and filtering to obtain the β-type ammonium tetramolybdate crystal seed.

Some embodiments disclose the method for preparing the large size β-type ammonium tetramolybdate monocrystal particle, which further comprises drying the β-type ammonium tetramolybdate crystal seed at the temperature of not exceeding 60° C.

Some embodiments disclose the method for preparing the large size β-type ammonium tetramolybdate monocrystal particle, therein the pH of the ammonium molybdate solution is adjusted by nitric acid to obtain the second ammonium molybdate solution.

Some embodiments disclose the method for preparing the large size β-type ammonium tetramolybdate monocrystal particle, therein the first temperature and the second temperature are controlled to be the same.

Some embodiments disclose the method for preparing the large size β-type ammonium tetramolybdate monocrystal particle, therein the second ammonium molybdate solution is stirred at rate of 100 r/min at constant temperature.

In another aspect, some embodiments disclose the large size β-type ammonium tetramolybdate monocrystal particle prepared by the method for preparing the large size of β-type ammonium tetramolybdate monocrystal particle, therein the particle size of β-type ammonium tetramolybdate monocrystal particle is a centimeter level size.

This disclosure provides a method for preparing large size β-type ammonium tetramolybdate monocrystal particle, by the way of controlling the pH, the concentration, the temperature and the crystallization time of the second ammonium molybdate solution, β-type ammonium tetramolybdate crystal seed is obtained. The obtained β-type ammonium tetramolybdate crystal seed is put stewing in the first ammonium molybdate solution and is naturally cooling, during which time, cooling crystallization and slow evaporation crystallization happen in combination, and large size β-type ammonium tetramolybdate monocrystal particle forms. By controlling of growth time of grain, size of the large size β-type ammonium tetramolybdate monocrystal particle is under control, and the size is at centimeter level. The method has prospective application in controlled preparation of large size β-type ammonium tetramolybdate monocrystal particle.

DETAILED DESCRIPTION OF EMBODIMENTS

Figure 1:
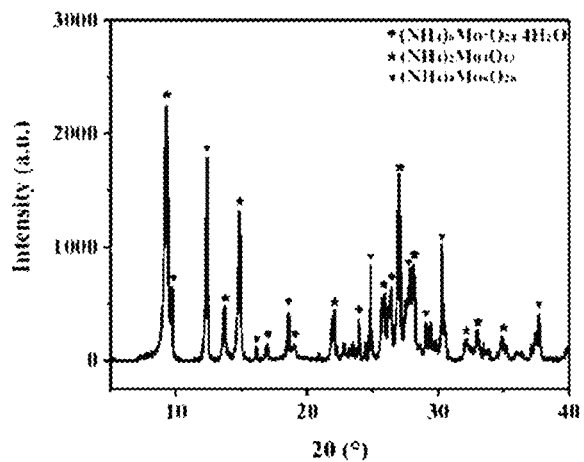
FIG. 1 is topographic image of industrial ammonium molybdate in embodiment 1.
Figure 1:
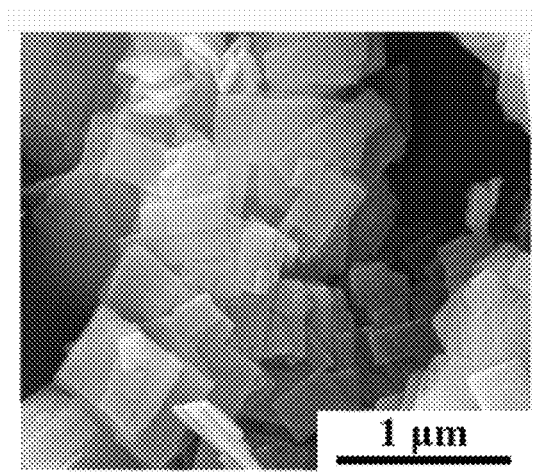
Figure 1:
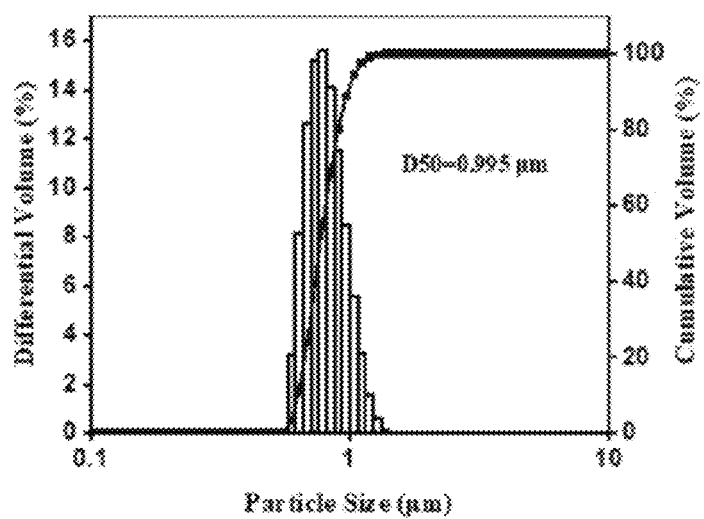

Here in present disclosure, the expression of "embodiment", as exemplary description of any embodiment, is not necessarily explained as better or greater one than any other embodiment. Performance test is conducted using ordinary method in the art, unless expressly stated otherwise. Understandably, the expression in present disclosure is merely to explain the specific embodiment, not to limit the scope of present disclosure.

Unless stated otherwise, technical and scientific phrases in present disclosure have the same meaning that the person with ordinary skill in the art understands in ordinary way. The test methods and technical tools, not expressly stated in present disclosure, usually refer to ordinary method and tool generally used in the art.

In present disclosure, phrases, like "basically", "about", are used to describe small variation. For example, they may mean less than or equal to the variation range of ±5%, or less than or equal to ±2%, or less than or equal to ±1%, or less than or equal to ±0.5%, or less than or equal to ±0.2%, or less than or equal to ±0.1%, or less than or equal to ±0.05%. Quantity and other data can be expressed as range of this type. Such range expression is used only for convenience and clarity, and can be explained as not only including the figures to define the range, but also the individuals in the range, or the sub-range in the range. For example, the range of "1~5%" can be understand as including the 1%, 5% expressly listed, and individual figure, like "2%", "3.5%", "4%" and sub range in the range, like as "1%~3%", "2%~4%", "3%~5%". The theory is also applied to range defined by one figure. Furthermore, the theory is applied to whatever data range with any width and whatever kind of characteristic. Unless it conflicts with context, the first and the second in this disclosure mean to differentiate different subject, not to mean order or sequence in time or place.

In present disclosure, including in claims, the conjunctions, for example, "including", "comprising", "containing", "referring to", "accommodating", are explained as open expression, meaning "including but not limited to". The conjunctions "is composed of" and "consisting of" are closed expression.

In order to better illustrate the present disclosure, much more details are provided in following embodiments. The one with ordinary skill in the art may understand that present disclosure can be implemented without certain details. In embodiments, some methods, tools, instruments familiar with the skilled one are not described in detail so as to focus on main content of present disclosure.

On the premise of no conflict, the technical characteristics disclosed in present embodiments can be combined in any possible way, the new embodiment obtained accordingly still falls in the scope of present disclosure.

In some embodiments, method of preparing the large size β-type ammonium tetramolybdate monocrystal particle comprises preparation of the β-type ammonium tetramolybdate crystal seed, specifically, including: industrial ammonium molybdate, ammonia, de-ionized water is used to prepare ammonium molybdate solution with concentration of 0.2~0.6 g/ml; pH of the ammonium molybdate solution is adjusted to 1~2, temperature of the ammonium molybdate solution is adjusted to a second temperature of 70~90° C., the second ammonium molybdate solution is obtained. The second ammonium molybdate solution is stirred at the second temperature for 3~5 min, crystallizing, filtering to obtain the β-type ammonium tetramolybdate crystal. The obtained β-type ammonium tetramolybdate crystal is applicable for crystal seed to grow the large size β-type ammonium tetramolybdate monocrystal particle. Generally in the crystallization process of ammonium tetramolybdate, crystallization rate has more important effect on control of the crystal form. If crystallization rate is too fast, crystallization process is difficult to manipulate resulting in formation of multiple crystal form of ammonium tetramolybdate, and too fast crystallization rate and too long crystallization time lead to much more crystalline grains in solution. These much more crystalline grains get to bond together forming bulky pseudo-particle. Molybdenum in ammonium molybdate solution adheres to the bulky pseudo-particle and form surface coating layer, bringing about fuzzing of crystal boundary and formation of mainly ammonium molybdate polycrystalline particle. If concentration of the second ammonium tetramolybdate solution is controlled at 0.2~0.6 g/ml, pH is adjusted to 1~2, temperature is modulated at 70~90° C., crystallization rate is under good control during constant temperature crystallization. Crystallization time is further controlled to prevent growing up of crystalline grain. Constant temperature crystallization goes on 3~5 minutes and crystalline grain in the second ammonium molybdate solution is taken out quickly to be separated from the second ammonium tetramolybdate solution, crystallization process stops and β-type ammonium tetramolybdate is obtained. No ammonium tetramolybdate of other crystal forms is formed.

In some alternative embodiments, nitric acid is used to adjust pH of ammonium molybdate to 1~2. Normally acid solution, such as nitric acid, is added into ammonium molybdate to modulate its pH, usually the pH is controlled to 1~2 to obtain the second ammonium molybdate solution.

In some alternative embodiments, the obtained β-type ammonium tetramolybdate crystal seed is dried at temperature of no exceeding 60° C. Normally speaking, too high dry temperature causes too fast drying rate, surface water taking away from crystal seed quickly gives rise to crystal seed surface cracking, going against complete and stable crystal seed. Dry temperature which is as close to the crystallization temperature as possible is appropriate. For example, dry temperature of 50~60° C. is an appropriate choice.

In some alternative embodiments, particle size of industrial ammonium molybdate is 0.7~1.1 μm, D50 particle size is 0.99 μm.

In some preferred alternative embodiments, temperature of the second ammonium molybdate solution is controlled to 80~90° C. The temperature of the second ammonium molybdate solution is also called the second temperature in this disclosure.

In some embodiments, method for preparing large size β-type ammonium tetramolybdate monocrystal particle includes: the obtained β-type ammonium tetramolybdate product is put in crystallization container as crystal seed, the first ammonium molybdate solution with concentration of 0.2~0.6 g/ml, pH of 5~7, temperature of 70~90° C., is poured into the crystallization container forming crystallization system. The crystallization system is standby at room temperature, the first ammonium molybdate solution cools naturally and the crystal seed grows up in the first ammonium molybdate solution as the large size β-type ammonium tetramolybdate monocrystal particle, size of which reaches at centimeter level. The crystallization system consists of the first ammonium molybdate solution and β-type ammonium tetramolybdate crystal seed in it. Normally speaking, during crystallization ammonium molybdate solution might be in three states: stable state, metastable state or unstable state. If ammonium molybdate solution is in stable state, the solution is unsaturated and concentration of the solution is smaller than equilibrium concentration, on this occasion, crystallization does not happen in unsaturated ammonium molybdate solution. If ammonium molybdate solution is in unstable state, concentration of the solution is higher than equilibrium concentration, on this occasion, crystallization happens immediately in unstable ammonium molybdate solution. If ammonium molybdate solution is in metastable, the solution is in saturation critical state, and concentration of the solution is equilibrium concentration, on this occasion, spontaneous nucleation does not occur. If there are crystal nucleus in metastable ammonium molybdate solution, the crystal nucleus serve as crystal seed and grow into crystal particle with solute of the solution attaching to the crystal seed. Therefore, β-type ammonium tetramolybdate particles is able to be distributed in metal stable ammonium molybdate solution serving as crystal seed, the β-type ammonium tetramolybdate crystal seed continues to grow under appropriate conditions, meanwhile preventing appearance of new β-type ammonium tetramolybdate crystal nucleus. Finally β-type ammonium tetramolybdate with single crystal form is obtained. Generally the concentration of the first ammonium molybdate solution suitable for growth of β-type ammonium tetramolybdate crystalline is 0.2~0.6 g/ml, the pH is 5~7, the temperature is 70~90° C. The β-type ammonium tetramolybdate crystalline is usually distributed separately in the first ammonium molybdate solution, which is standing still at room temperature, evaporating naturally, molybdenum ion continues to precipitate on the crystal seed, the crystal seed growing into large size ammonium tetramolybdate monocrystal particle with larger size. Normally speaking, with increase of growth time, the crystal size of the large size ammonium tetramolybdate monocrystal increases; and the size of the large size ammonium tetramolybdate monocrystal particle increases, where the size is a centimeter level size.

Normally in order to control growth of large size β-type ammonium tetramolybdate monocrystal particle, and take good control of specific size of the monocrystal particle, quantity of β-type ammonium tetramolybdate crystal seed in the first ammonium molybdate solution needs to be strictly controlled. Usually small quantity of β-type ammonium tetramolybdate crystal seed is propitious to the growth of large size β-type ammonium tetramolybdate monocrystal particle. Furthermore, β-type ammonium tetramolybdate crystal seed needs to be separately distributed in the first ammonium molybdate solution to prevent mutual interference of the crystal seeds during its continuing growth. As one example, screen mesh is used to distribute β-type ammonium tetramolybdate crystal seeds separately on bottom surface of the crystallization container.

In some alternative embodiments, the first ammonium molybdate solution is supplemented into the crystallization system to make up consumption of the ammonium molybdate solute of the first ammonium molybdate solution of crystallization system, availing of growth of larger size β-type ammonium tetramolybdate monocrystal particle. Generally the supplemented first ammonium molybdate solution is the same as the first ammonium molybdate solution originally forming the crystallization system, namely, having the same constitution, concentration, pH and temperature. In some alternative embodiments, the first ammonium molybdate solution is supplemented several times.

In some alternative embodiments, the first ammonium molybdate solution is prepared as follows: industrial ammonium molybdate, ammonia and de-ionized water are used to prepare ammonium molybdate solution with concentration of 0.2~0.6 g/ml; using nitric acid to modulate pH of ammonium molybdate solution at 5~7, solution temperature is modulated at the first temperature of 70~90° C., to obtain the first ammonium molybdate solution. Usually the temperature of the first ammonium molybdate solution is also called the first temperature.

In some preferred embodiments, the temperature of the first ammonium molybdate solution is controlled at 80~90° C.

In some alternative embodiments, the first temperature of the first ammonium molybdate solution is controlled to be the same as the second temperature of the second ammonium molybdate solution.

In some embodiments, the concentration of the first ammonium molybdate solution is controlled to be the same as the concentration of the second ammonium molybdate solution.

Technical details are to be exemplarily described further in following embodiments.

Embodiment 1

Preparation of Large Size β-Type Ammonium Tetramolybdate Monocrystal Particle

The method in embodiment 1 for preparing large size β-type ammonium tetramolybdate monocrystal particle comprises steps:

(1) Getting certain amount of industrial ammonium molybdate, together with ammonia and de-ionized water, to prepare ammonium molybdate solution with concentration of 0.5 g/ml.

(2) Adding nitric acid well distributed in the ammonium molybdate solution until the end pH is 2, and then heating the ammonium molybdate solution to temperature of 80° C., forming the second ammonium molybdate solution; the second ammonium molybdate solution is stirred and crystallized at constant temperature of 80° C. at the rate of 100 r/min for 5 min.

(3) The crystallized second ammonium molybdate solution obtained in step (2) is filtered while it is still hot, to form the β-type ammonium tetramolybdate.

(4) The β-type ammonium tetramolybdate obtained in step (3) is put in vacuum drying oven and dried at 50° C., to obtain the β-type ammonium tetramolybdate crystal seed.

(5) The β-type ammonium tetramolybdate crystal seed obtained in step (4) is distributed separately by using of screen mesh in culture plate.

(6) Getting certain amount of industrial ammonium molybdate, together with ammonia and de-ionized water, prepare ammonium molybdate solution with concentration of 0.5 g/ml. Adding nitric acid well distributed in the ammonium molybdate solution until the end pH is 5, and then heating the ammonium molybdate solution to temperature of 80° C., to form the first ammonium molybdate solution; the first ammonium molybdate solution is poured into the culture plate loaded with β-type ammonium tetramolybdate crystal seed. The culture plate then stands still at room temperature, naturally cooling, the first ammonium molybdate solution being evaporating slowly, and the β-type ammonium tetramolybdate crystal seed being continuing to grow up, finally, large size β-type ammonium tetramolybdate monocrystal particle is obtained.

The large size β-type ammonium tetramolybdate monocrystal particle obtained in step (6) is taken out using tweezers and solution on the particle is sucked dry, and the particle is put in clean environment for natural air drying. XRD and SEM are used to analyze the particle.

In embodiment 1, process of step (6) is alternatively repeated, products in culture plate are collected at different time of 6 h, 12 h, 24 h, 36 h, 48 h, β-type ammonium tetramolybdate monocrystal particles with different size are obtained.

In embodiment 1, industrial ammonium molybdate, ammonia and de-ionized water are used to prepare ammonium molybdate solution with concentration of 0.2~0.6 g/ml, and then part of the ammonium molybdate solution is used to prepare the first ammonium molybdate solution by adjusting pH and temperature; part of the ammonium molybdate is used to prepare the second ammonium molybdate solution by modulating pH and temperature. Concentration of the first ammonium molybdate solution is the same as that of the second ammonium molybdate solution.

FIG. 1 is topographic image of industrial ammonium molybdate in embodiment 1, therein, the above is XRD spectrum of industrial ammonium molybdate, the middle is the SEM picture of industrial ammonium molybdate, and the bottom is laser particle size distribution of industrial ammonium molybdate. Results show that particle size of industrial ammonium molybdate crystalline grain is between 0.7~1.1 μm, D50 particle size is 0.99 μm, and the ammonium molybdate has multiple crystal forms.

Figure 2A:
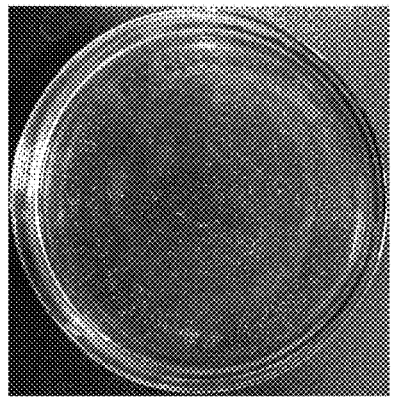
FIGS. 2(a)-2(e) are schematic image of different growth stages of large size β-type ammonium tetramolybdate monocrystal particle in embodiment 1.
Figure 2:
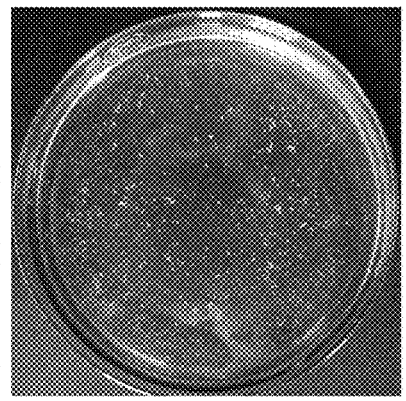
Figure 2C:
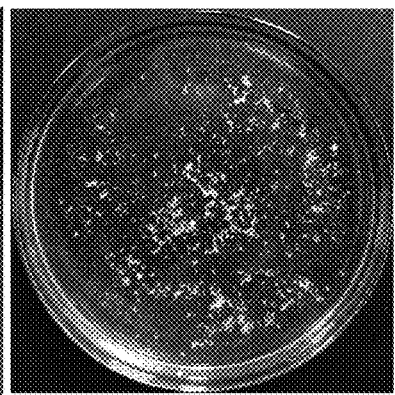
Figure 2:
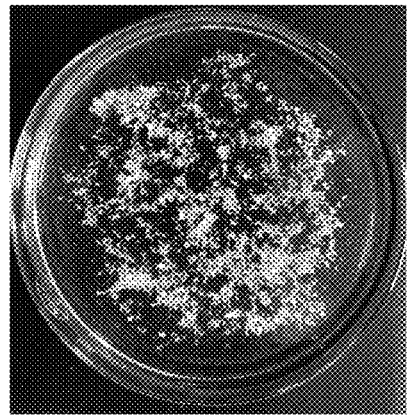
Figure 2E:
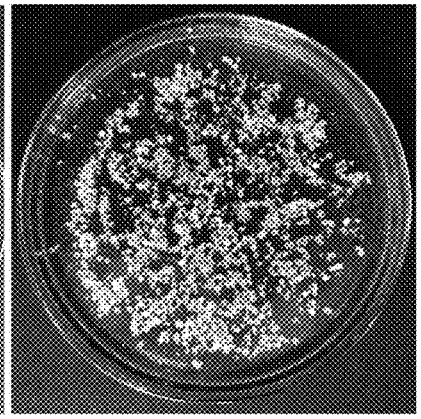

FIGS. 2(a)-2(e) are schematic image of different growth stages of large size β-type ammonium tetramolybdate monocrystal particle in embodiment 1, displaying morphology of large size β-type ammonium tetramolybdate monocrystal particle in different growth time, therein, the picture of FIG. 2 (a), FIG. 2(b), FIG. 2(c), FIG. 2(d), FIG. 2(e) separately correspond to crystallization time of 6 h, 12 h, 24 h, 36 h, 48 h. It can be seen that with growth time getting longer, particle size of β-type ammonium tetramolybdate monocrystal particle gets bigger, amount of β-type ammonium tetramolybdate monocrystal particle increases.

Figure 3A:
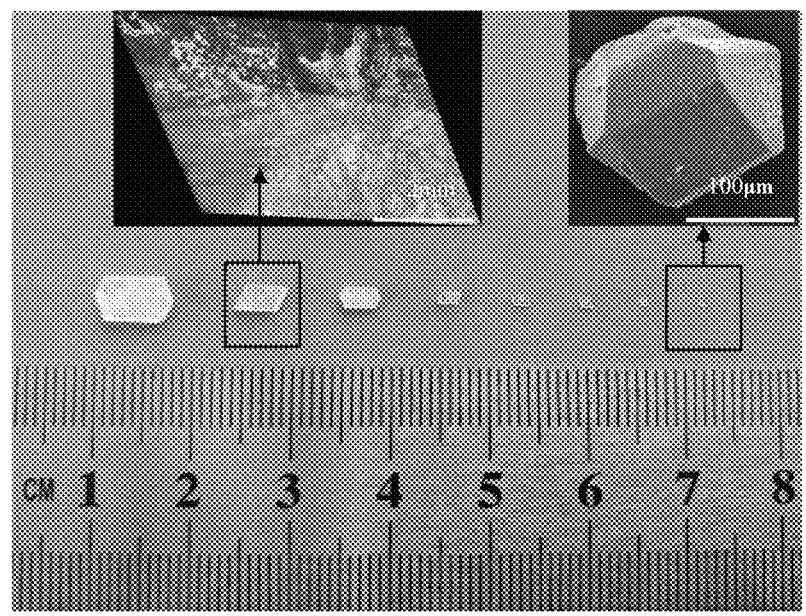
FIGS. 3(a) and 3(b) are topographic images of large size β-type ammonium tetramolybdate monocrystal particle in different growth stages in embodiment 1.
Figure 3B:
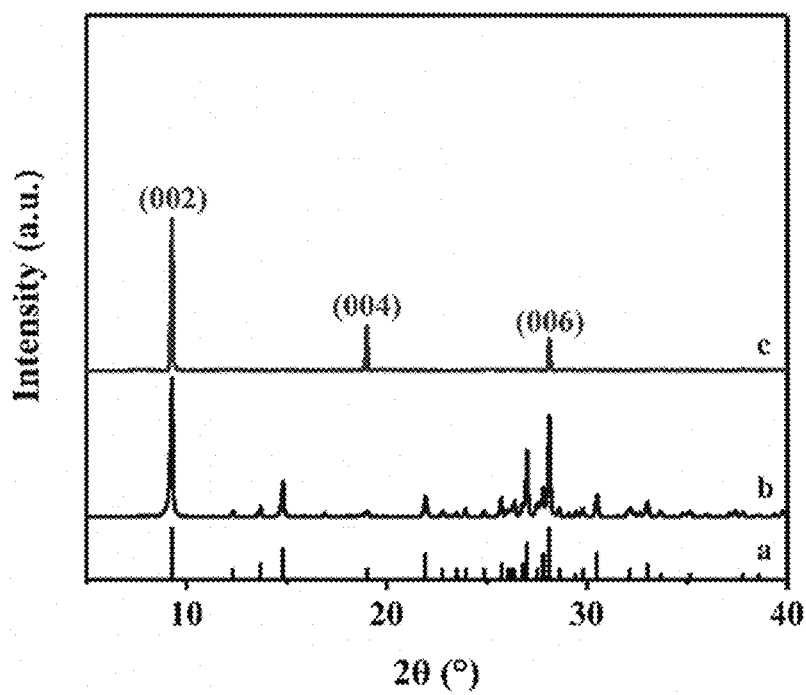
Figure 4:
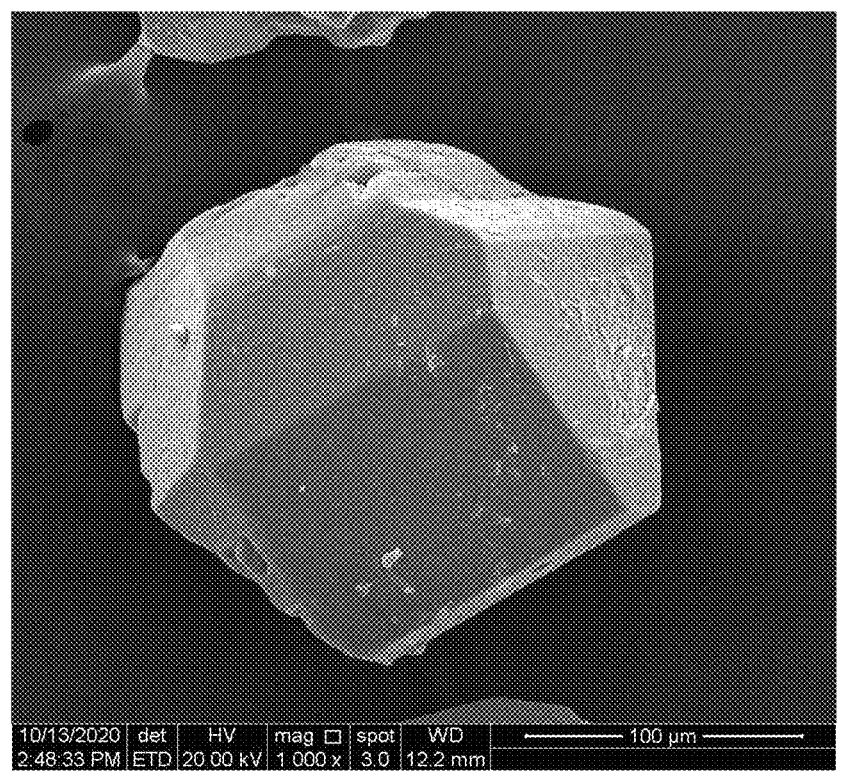
FIG. 4 is SEM image of large size β-type ammonium tetramolybdate monocrystal particle in embodiment 1.
Figure 5A:
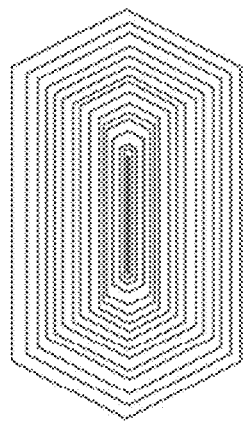
FIGS. 5(a)-5(d) are schematic diagram of growth theory of large size β-type ammonium tetramolybdate monocrystal particle.
Figure 5B:
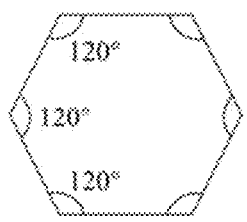
Figure 5C:
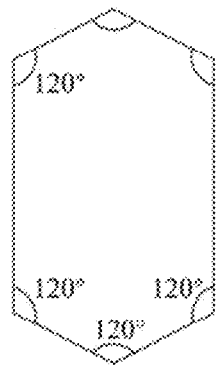
Figure 5D:
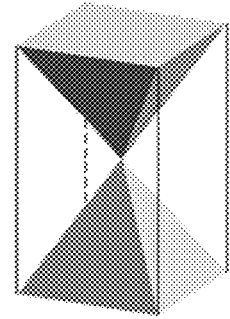

FIGS. 3(a) and 3(b) are topographic images of large size β-type ammonium tetramolybdate monocrystal particle in different growth stages in embodiment 1, therein, picture FIG. 3 (a) is morphology picture of the β-type ammonium tetramolybdate monocrystal particle with different size, the size of the first β-type ammonium tetramolybdate monocrystal particle on the left is 9 mm estimated from the scale in the picture; the size of the second β-type ammonium tetramolybdate monocrystal particle estimated from the scale in the picture is 5 mm, its morphology is displayed as picture pointed by the corresponding arrow; the size of the third β-type ammonium tetramolybdate monocrystal particle is 4 mm; the size of the fourth β-type ammonium tetramolybdate monocrystal particle is 3 mm; the size of the fifth β-type ammonium tetramolybdate monocrystal particle is 2 mm; the size of the sixth β-type ammonium tetramolybdate monocrystal particle is 1.6 mm; the size of the seventh β-type ammonium tetramolybdate monocrystal particle is 0.8 mm. The size of large size ammonium tetramolybdate monocrystal particle decreases from left to right in the picture, the size of the first large size ammonium tetramolybdate monocrystal particle on the right is 0.2 mm, its morphology is demonstrated in the picture pointed by corresponding arrow, its enlarged morphology is displayed by the SEM picture of FIG. 4. FIG. 4 is SEM image of the large size β-type ammonium tetramolybdate monocrystal particle in embodiment 1. It can be seen that the monocrystal has regular geometric shape, polyhedral morphology with flat crystallographic plane and straight crystal edge; enlarged picture shows that there are obvious ribbon structures on the crystal plane, and the crystal grain has certain angle, it can be approved that the β-type ammonium tetramolybdate obtained is monocrystal particle. Image FIG. 3(b) is XRD spectrum of β-type ammonium tetramolybdate, therein, the above spectrum is standard spectrum of β-type ammonium tetramolybdate, the middle spectrum is that of β-type ammonium tetramolybdate polycrystalline, the bottom spectrum is that of β-type ammonium tetramolybdate monocrystal obtained in embodiment 1.

From FIGS. 3(a)-3(b) and FIG. 4, it can be known that the β-type ammonium tetramolybdate monocrystal particle obtained has polyhedral morphology with flat crystallographic plane and straight crystal edge; the enlarged picture shows that there are obvious ribbon structures on crystal plane, and crystal grain has certain angle, this phenomenon conforms to layer growth theory of grain. FIGS. 5(a)-5(d) are schematic diagram of growth theory of the large size β-type ammonium tetramolybdate monocrystal particle. According to the layer growth theory of grain, crystal is easy to grow into polyhedral structure with flat crystallographic plane and straight edge, during crystal growth process, due to the effect of its environment, crystal growing in different time shows some subtle changes in constitution and physical characteristics, accordingly, some ribbon structures appear on surface of crystal, as showed in FIG. 5(a). Due to parallel growth of crystallographic plane towards outside, angle between different crystallographic planes remains the same for the same compound, as showed in 1o FIG. 5 (b) and FIG. 5(c), during growth process of crystal, large quantity of crystallographic plane grow towards outside forming conical body with center of crystal as pinnacle. The conical body is called growth cone, as showed in FIG. 5(d).

Test results of embodiment 1 show that the large size β-type ammonium tetramolybdate monocrystal particle prepared using industrial ammonium molybdate has single crystal form, and the size of the β-type ammonium tetramolybdate monocrystal particle can be controlled, and the large size of β-type ammonium tetramolybdate monocrystal particle can be prepared, the size of β-type ammonium tetramolybdate monocrystal particle obtained in embodiment 1 is between 0.2~9 mm.

Comparative Example 1

(1) Getting certain amount of industrial ammonium molybdate, together with ammonia and de-ionized water, to prepare the first ammonium molybdate solution with concentration of 0.2~0.6 g/ml.

(2) Adding nitric acid well distributed in the first ammonium molybdate solution until the end pH is 2, and the first ammonium molybdate solution is stirred and crystallized at constant temperature of 40° C. at the rate of 100 r/min for 30 min.

(3) The crystallized first ammonium molybdate solution obtained in step (2) is filtered while it is still hot to form ammonium tetramolybdate product.

(4) The ammonium tetramolybdate product obtained in step (3) is put in vacuum drying oven and dried at 50° C. to obtain the ammonium tetramolybdate crystal.

Analyzing the ammonium tetramolybdate crystal product obtained in comparative example 1, results show that the product is mixture of ammonium dimolybdate, ammonium tetramolybdate, ammonium heptamolybdate, and ammonium octamolybdate.

Comparative Example 2

(1) Getting certain amount of industrial ammonium molybdate, together with ammonia and de-ionized water to prepare the first ammonium molybdate solution with concentration of 0.2~0.6 g/ml.

(2) Adding nitric acid well distributed in the first ammonium molybdate solution until the end pH is 2, and the first ammonium molybdate solution is stirred and crystallized at constant temperature of 80° C. at the rate of 100 r/min for 30 min.

(3) The crystallized first ammonium molybdate solution obtained in step (2) is filtered while it is still hot to form the ammonium tetramolybdate product.

(4) The ammonium tetramolybdate product obtained in step (3) is put in vacuum drying oven and dried at 50° C. to obtain the ammonium tetramolybdate crystal.

Analyzing the ammonium tetramolybdate crystal product obtained in comparative example 2, results show that the product is β-type ammonium tetramolybdate polycrystalline.

This disclosure provides a method for preparing large size β-type ammonium tetramolybdate monocrystal particle, by way of controlling pH, concentration, temperature and crystallization time of the second ammonium molybdate solution, the β-type ammonium tetramolybdate crystal seed is obtained. The obtained β-type ammonium tetramolybdate crystal seed is put stewing in the first ammonium molybdate solution and is naturally cooling, during which time, cooling crystallization and slow evaporation crystallization happen in combination, and large size β-type ammonium tetramolybdate monocrystal particle forms. By controlling of growth time of grain, size of large size β-type ammonium tetramolybdate monocrystal particle is under control, and the size is at centimeter level. The method has prospective application in controlled preparation of large size β-type ammonium tetramolybdate monocrystal particle.

The technique details provided in present disclosure and embodiments only serve as illustrating the inventive concept, not as limiting the scope of the technical solutions. Any change or substitute for the technique details without inventive step share the same inventive concept as present disclosure, and fall into the scope of protection the present claims sought.

The invention claimed is:

1. A method for preparing a large size beta-type ammonium tetramolybdate monocrystal particle, wherein, the method comprises:
    industrial ammonium molybdate, ammonia water, and de-ionized water are used to prepare an ammonium molybdate solution with a concentration of 0.2~0.6 g/ml; pH of the ammonium molybdate solution is adjusted to 5~7, and temperature of the ammonium molybdate solution is adjusted to a first temperature of 70~90° C. to obtain a first ammonium molybdate solution; and
    a beta-type ammonium tetramolybdate crystal seed is put in a crystallization container, and the first ammonium molybdate solution is poured into the crystallization container to form a crystallization system; the crystallization system stands still at a room temperature, naturally cooling, and the beta-type ammonium tetramolybdate crystal seed grows up as a large size beta-type ammonium tetramolybdate monocrystal particle product,
    wherein the beta-type ammonium tetramolybdate crystal seed is prepared by:
    using industrial ammonium molybdate, ammonia water, and de-ionized water to prepare the ammonium molybdate solution with the concentration of 0.2~0.6 g/ml;
    adjusting the pH of the ammonium molybdate solution to 1~2, adjusting the temperature of the ammonium molybdate solution to a second temperature of 70~90° C. to obtain a second ammonium molybdate solution; and
    stirring the second ammonium molybdate solution at a constant temperature of the second temperature, crystallizing at the constant temperature for 3~5 mins, and filtering to obtain the beta-type ammonium tetramolybdate crystal seed.

2. The method for preparing the large size beta-type ammonium tetramolybdate monocrystal particle of claim 1, wherein the pH of the ammonium molybdate solution is adjusted to 5~7 by nitric acid, to obtain the first ammonium molybdate solution.

3. The method for preparing the large size beta-type ammonium tetramolybdate monocrystal particle of claim 1, further comprising drying the obtained beta-type ammonium tetramolybdate crystal seed at a temperature not exceeding 60° C.

4. The method for preparing the large size beta-type ammonium tetramolybdate monocrystal particle of claim 1, wherein the pH of the ammonium molybdate solution is adjusted by nitric acid to obtain the second ammonium molybdate solution.

5. The method for preparing the large size beta-type ammonium tetramolybdate monocrystal particle of claim 1, wherein the first temperature and the second temperature are controlled to be the same.

6. The method for preparing the large size beta-type ammonium tetramolybdate monocrystal particle of claim 1, wherein a particle size of the industrial ammonium molybdate is between 0.7~1.1 μm, and D50 is 0.99 μm.

7. The method for preparing the large size beta-type ammonium tetramolybdate monocrystal particle of claim 1, wherein the concentration of the first ammonium molybdate solution is controlled to be the same as the concentration of the second ammonium molybdate solution.

8. The method for preparing the large size beta-type ammonium tetramolybdate monocrystal particle of claim 1, wherein the second ammonium molybdate solution is stirred at a constant temperature at a rate of 100 r/min.

\* \* \* \* \*